United States Patent [19]
Ino

[11] Patent Number: 4,921,816
[45] Date of Patent: May 1, 1990

[54] METHOD OF MAKING A TRENCH DRAM

[75] Inventor: Masayoshi Ino, Tokyo, Japan

[73] Assignee: Oki Electric Industry Co., Ltd., Tokyo, Japan

[21] Appl. No.: 281,998

[22] Filed: Dec. 9, 1988

Related U.S. Application Data

[62] Division of Ser. No. 108,795, Oct. 15, 1987, abandoned.

[30] Foreign Application Priority Data

Oct. 22, 1986 [JP] Japan .................. 61-249436

[51] Int. Cl.⁵ .................. H01L 21/72; H01L 21/285
[52] U.S. Cl. .................. 437/52; 437/47; 437/38; 437/60; 437/203; 357/23.6
[58] Field of Search .................. 437/47, 60, 203, 52, 437/228; 357/23.6

[56] References Cited

FOREIGN PATENT DOCUMENTS 0164829 12/1985 European Pat. Off. .
0187596 7/1986 European Pat. Off. .
0015345 1/1986 Japan .................. 437/67

Primary Examiner—Brian E. Hearn
Assistant Examiner—T. Thomas
Attorney, Agent, or Firm—Spencer & Frank

[57] ABSTRACT

In a semiconductor memory integrated circuit comprising a semiconductor substrate with a surface trench, a thick oxide film is formed to cover the inner wall of the trench substrate except part thereof where the inner wall is exposed. A cell capacitor comprises a lower electrode, a dielectric layer and an upper electrode, the lower electrode being in contact with the exposed part of the inner wall of the trench. A cell transfer transistor is formed in the semiconductor substrate adjacent to the cell capacitor, wherein one of the diffusion layers is in contact with the lower electrode of the cell capacitor at the exposed part of the inner wall of the trench.

8 Claims, 6 Drawing Sheets

FIG.IE
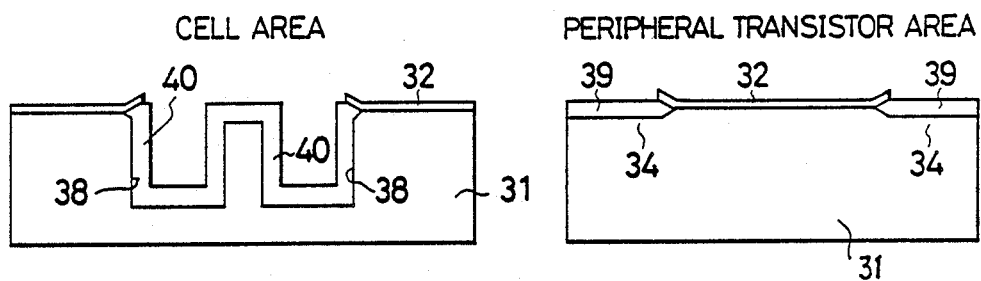
FIG.IF
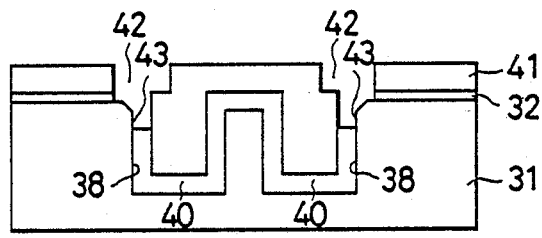
FIG.IG
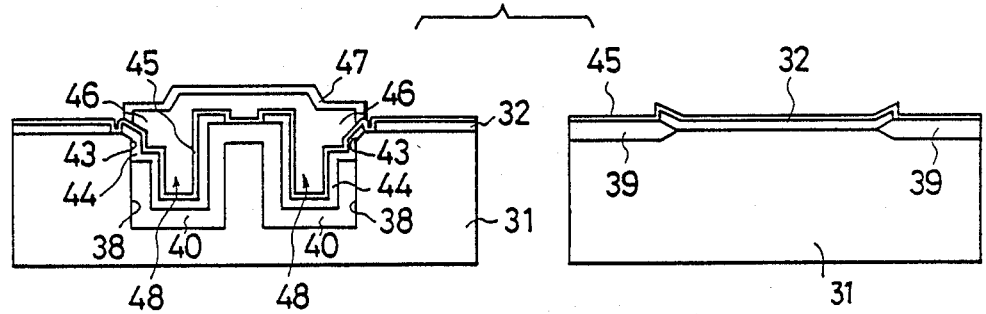

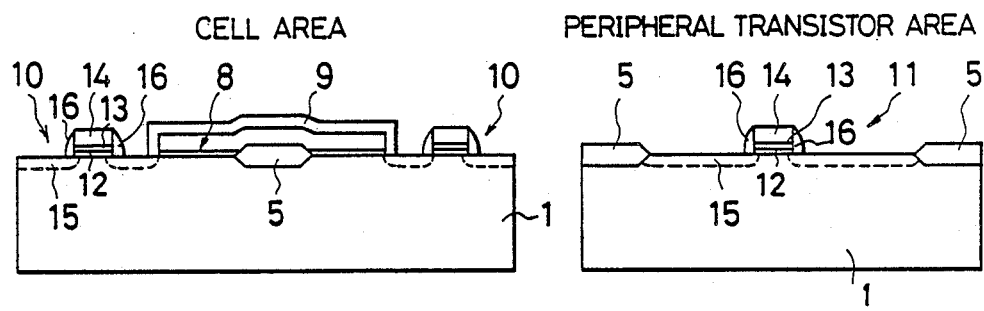
PRIOR ART
FIG. 3E
FIG. 3F
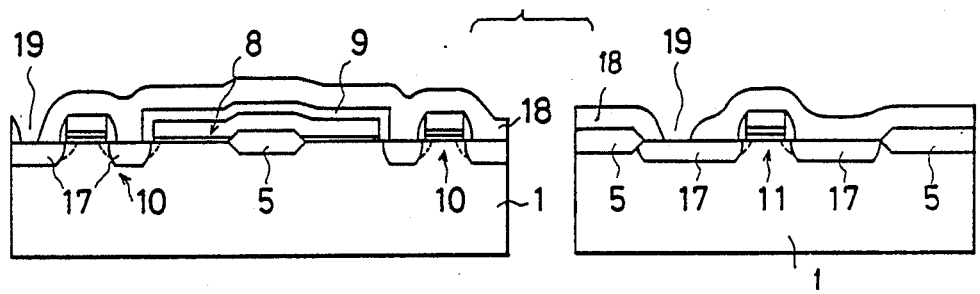
FIG. 3G
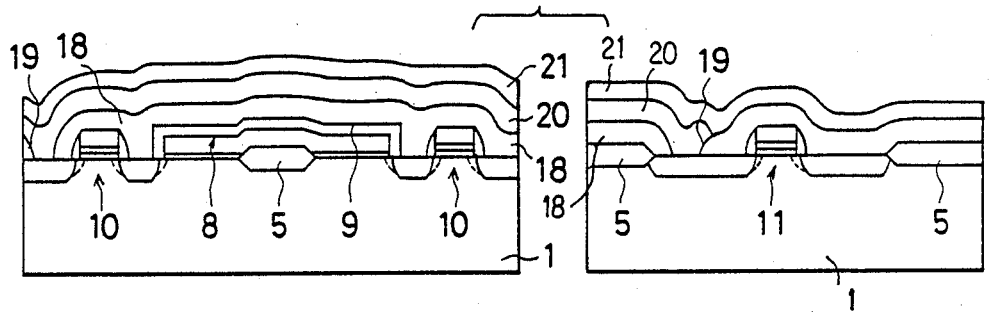

1

METHOD OF MAKING A TRENCH DRAM

This is a continuation of application Ser. No. 07/108,795 filed Oct. 15, 1987, now abandoned.

BACKGROUND OF THE INVENTION

This invention concerns a semiconductor memory integrated circuit, in particular a MOS 1Tr/1C (1 transistor/1 capacitor) semiconductor memory integrated circuit, and a method of its manufacture.

FIG. 3 is a sectional diagram of the steps in the conventional process used to manufacture a MOS 1Tr/1C semiconductor memory integrated circuit. In the figure, the cell area is shown on the left and the peripheral transistor area on the right.

As shown by the figures, in the conventional manufacturing process, a SiN/SiO2 laminated film 2 is deposited as a selective oxidation mask on a silicon substrate 1 (FIG. 3A).

The laminated film 2 is etched to form openings 4 at such parts of the substrate 1 where isolation oxide areas 3 (referred to hereafter as field areas) are to be formed (FIG. 3B). Impurities are ion implanted to form channel stops of a fairly high concentration and of the same conductivity type as substrate 1 (FIG. 3B) and an isolation oxide film 5 is then formed in the field area 3 by thermally oxidizing laminated film 2 as a mask.

After removing laminated film 2, a dielectric layer 6 and a capacitor electrode, for example a polysilicon layer 7, are formed in turn in a cell capacitor area of substrate 1 so as to form a cell capacitor 8, and this capacitor is then covered with an insulating film 9 (FIG. 3D).

A cell transfer transistor 10 and a peripheral transistor 11 are then formed in the cell transfer transistor area and peripheral transistor area of substrate 1, as follows. This can be achieved in the following manner. First, a gate of the polyside structure is made by forming, on substrate 1, a gate insulating film 12, a conducting polysilicon layer 13, and a metal silicide layer 14. This gate is used as a mask to form, in substrate 1, diffusion layer 15 of impurities of fairly high concentration and of opposite conductivity type to substrate 1, and side walls of insulating material 16 are formed on the wall of the gate. Then, using the side walls 16 and the gate as a mask, a diffusion layer 17 of impurities of high concentration and opposite conductivity type to subs&rate 1, is formed in substrate 1. Thus transistors 10, 11 of the LDD (Lightly Doped Drain) structures are formed (FIGS. 3E, F).

When transistors 10 and 11 have been formed, an insulating layer 18 is formed over the entire surface of substrate 1, and contact holes 19 are opened in order to make contact between the diffusion layers 15 of the transistors and a metalization layer that will be later formed (FIG. 3F).

Finally, a metallization layer 20 which is in contact with the diffusion layers 15 of the transistors 10, 11 through the contact holes 19 is formed on insulating layer 18, and a passivation film 21 is deposited on this to give the final structure (FIG. 3G).

In the above method, however, as the cell capacitor 8 formed on the surface of substrate 1 is planar, it is impossible to avoid a large loss of capacitance when surface areas are reduced and densities are increased, and moreover, as capacitor is formed between the cell capacitor electrode and substrate 1, soft errors due to α rays and other radiation were a problem.

SUMMARY OF THE INVENTION

This invention aims to overcome the above disadvantages by giving high capacitance for small surface area, and by providing a method of manufacturing a semiconductor integrated circuit with a cell capacitor that is highly resistant to soft errors.

In this invention, a trench is formed on a semiconductor substrate, a thick oxide film is formed on its inner wall, and a cell capacitor is formed on the inner wall covered with the thick oxide film, this capacitor comprising a lower electrode, a dielectric layer and an upper electrode. The thick oxide film is not formed on part of the inner wall of said trench, and contact between the lower electrode of the cell capacitor and the diffusion layer of the cell transfer transistor being made at this exposed part of the inner wall.

In the above structure, the cell capacitor is formed three-dimensionally using the depth of the trench, and it therefore has a high capacitance for small surface area. Also, as &he cell capacitor is insulated from the semiconductor substrate by the thick oxide film, it has higher resistance to soft errors. Further, as the lower electrode of the cell capacitor is in contact with the diffusion layer of cell transfer transistor on part of the trench inner wall, the surface area of the substrate required for the con&act is extremely small.

BRIEF DESCRIPTION OF THE DRAWINGS

FIGS. 1A to 1J are cross sectional views showing various steps of fabrication according to an embodiment of the invention.

FIGS. 3A to 3G are cross sectional views showing various steps of fabrication in the prior art.

DETAILED DESCRIPTION OF THE PREFERRED EMBODIMENT

An embodiment of the invention will now be described with reference to FIGS. 1A to 1J and FIG. 2. In FIGS. 1A to 1J, the cell area is on the left and the peripheral transistor area on the right. FIG. 2 is a plan view of a completed cell. The cell part in FIGS. 1A to 1J is a sectional view taken through the line A—A in FIG. 2.

As shown by FIGS. 1A to 1J, in this embodiment of the invention, a SiN/SiO2 laminated film 32 is first deposited on substrate 31 (FIG. 1A) as a selective oxidation mask.

Figure 1A:
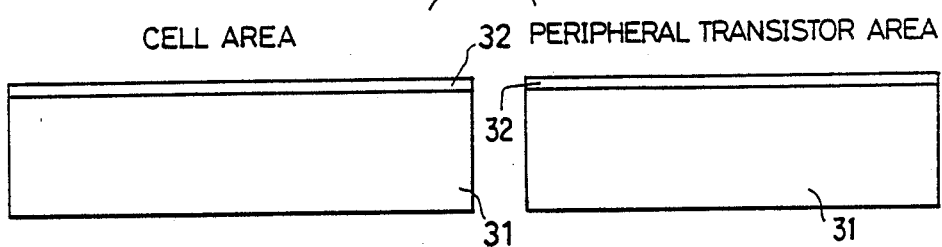
Figure 1B:
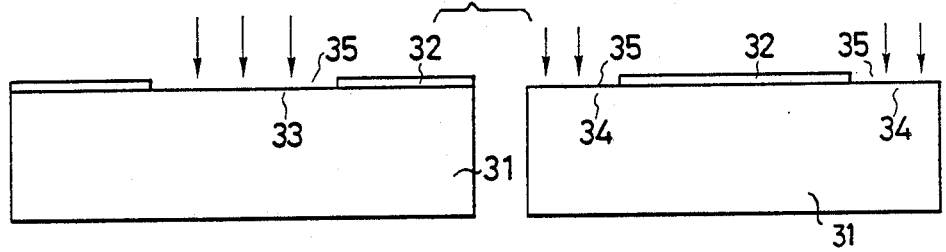
Figure 1C:
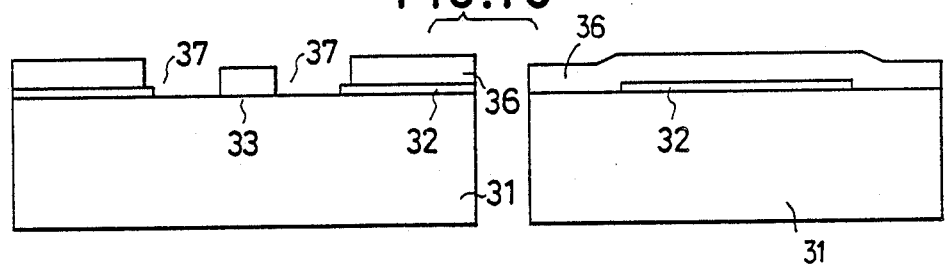
Figure 2:
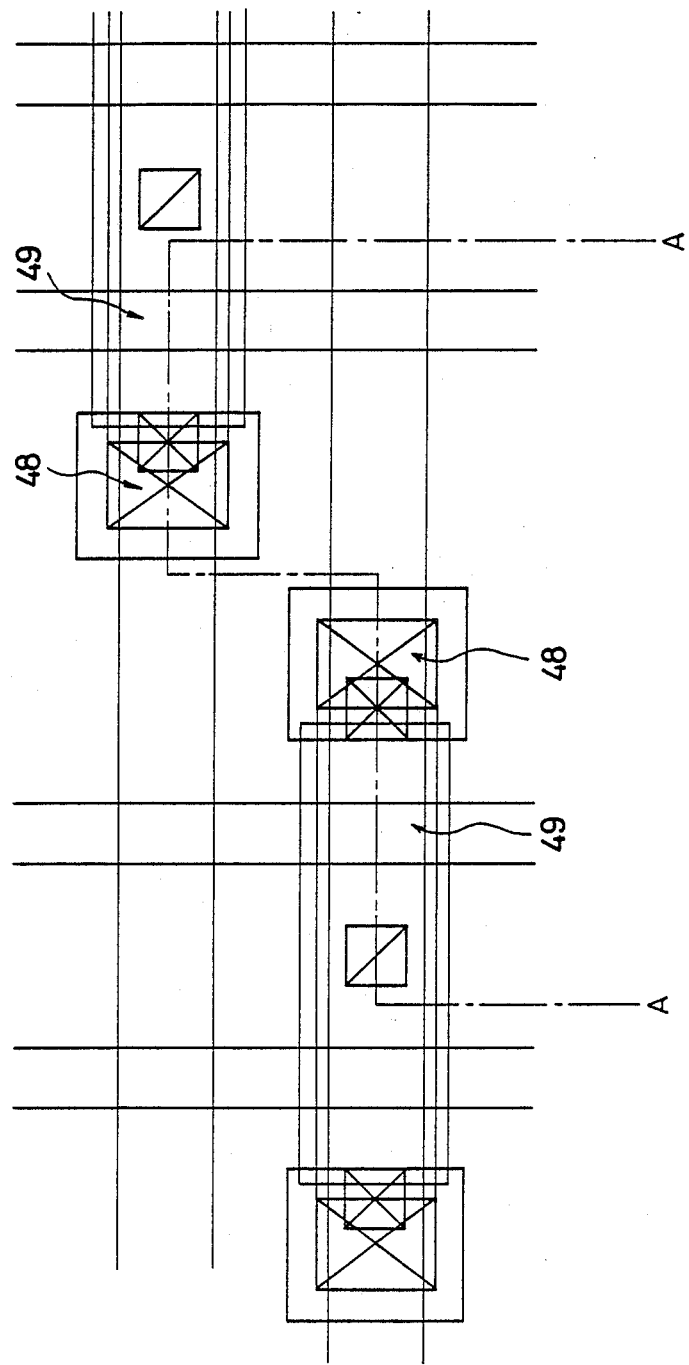
FIG. 2 is a plan view showing memory cells produced by the method of the invention.

The laminated film 32 in a cell capacitor area 33 and an isolation oxide area 34 of substrate 31 is then etched to form openings 35, and ion implantation is carried out through openings 35 so as to form channel stops in the cell capacitor area 33 and isolation oxide area 34 (FIG. 1B).

Figure 3A:
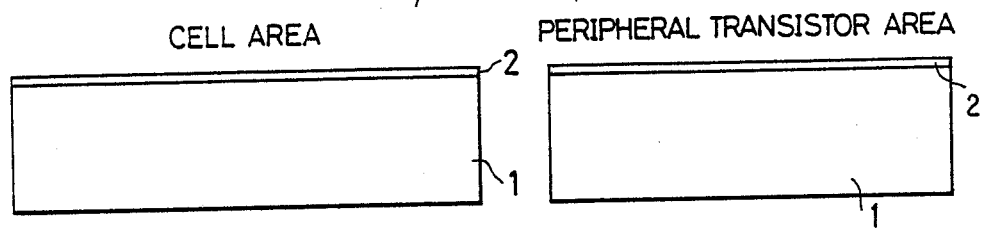
Figure 3B:
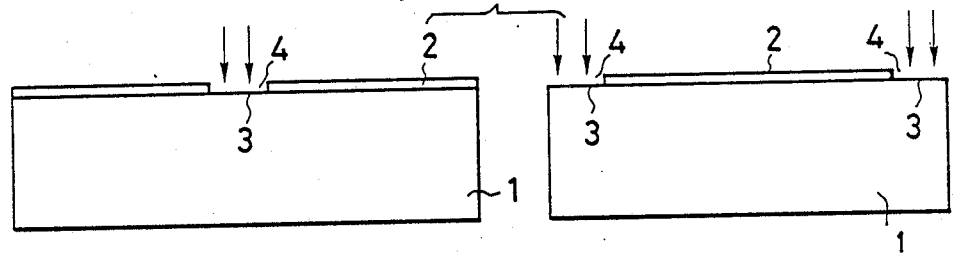
Figure 3C:
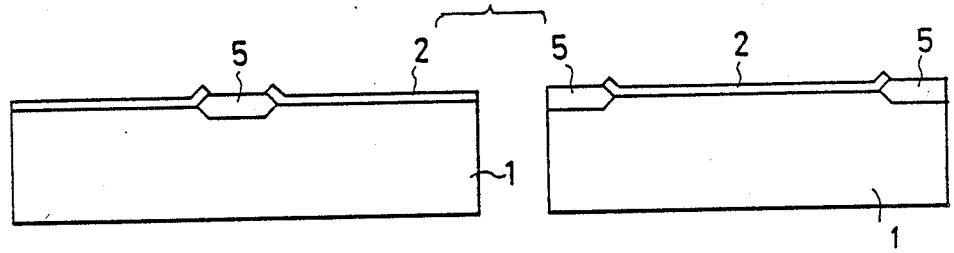
Figure 3D:
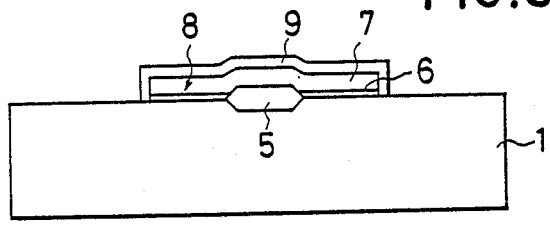

An etching mask 36, comprising an insulating film, photoresist or a combination of the two, is then formed over the entire surface of substrate 31 to a thickness of 1000 to 10000 Å, and openings 37 are formed in this mask 36 in order to form trenches in the cell capacitor area 33 of substrate 31 (FIG. 3C).

Figure 1D:
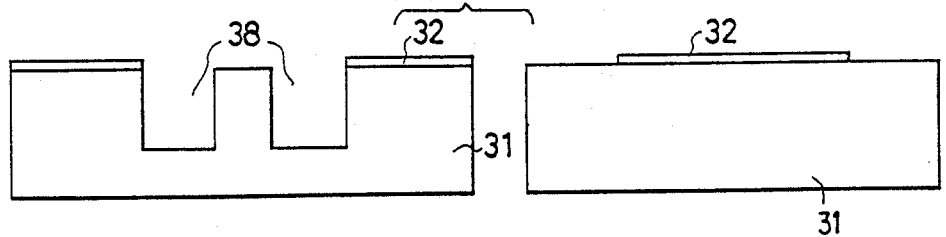

Using the etching mask 36, RIE (Reactive Ion Etching) is then carried out so as to etch each cell capacitor area 33 of substrate 31 to a depth of 1-10 μm, and thereby form a pair of trenches 38 of the aforesaid depth in area 33. Etching mask 36 is then removed (FIG. 1D).

Using laminated film 32 as a mask, an isolation oxide film or layer 39 of thickness 1000–7000 Å is formed by thermal oxidation in the isolation oxide area 34 of substrate 31, and at the same time, a relatively thick oxide film 40 identical to the isolation oxide film 39 is formed on the inner wall of the trench 38 (FIG. 1E) as a side wall oxide layer 40.

Instead of being formed simultaneously, oxide film 40 on the inner wall of trench 38 and isolation oxide film 39 may be formed at different process steps and with different thicknesses.

A photoresist 41 is then coated as an etching mask onto substrate 31 and trench 38 in such a way as to planarize the surface. The photoresist 41 may be a single layer or multiple layered. In the case of a single layer, a positive resist is used; in the case of multiple layers, the lower layer may be PMMA of thickness 10 KÅ–20 KÅ, and the upper layer may be a positive resist. An opening 42 is formed over the inner wall of each trench 38 on the cell transfer transistor side. The oxide film 40 is then removed from the inner wall by dry etching through this opening to form an exposed area 43 (FIG. 1F) on the inner wall near the respective edge of the trench.

After a photoresist 41 has been removed the capacitor lower electrode or lower capacitor plate 44 is formed, for example by depositing conducting polysilicon and patterning, on the inner wall of the exposed area 43 of the trench 38 and on the inner wall of the remainder of the oxide film 40 covering the inner wall of the trench. A dielectric layer 45 consisting of SiN/SiO₂ is then deposited over the whole surface including the inner wall of this lower electrode 44. Following this, the capacitor upper electrode 46 is formed, for example by depositing conducting polysilicon and patterning, on the inside of said dielectric layer 45 so as to fill trench 38. The upper electrode 46 is then covered with an insulating layer 47 (FIG. 1G).

In this way a cell capacitor 48, comprising a lower electrode 44, a dielectric layer 45 and an upper electrode 46, is formed in each of the trenches 38 which are covered by the relatively thick oxide film 40. The lower electrode 44 of cell capacitor 48 is in contact with the inner wall of trench 38 (in the semiconductor substrate 31) near the edge of trench 38 and on the side of the trench 38 where to an adjacent cell transfer transistor is formed.

Figure 1H:
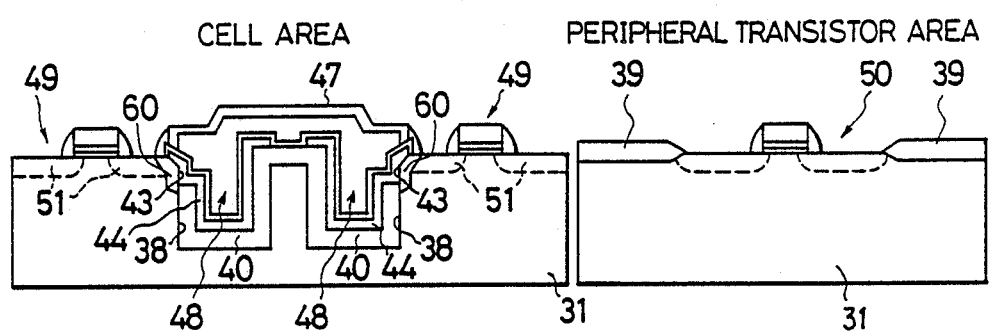
Figure 1I:
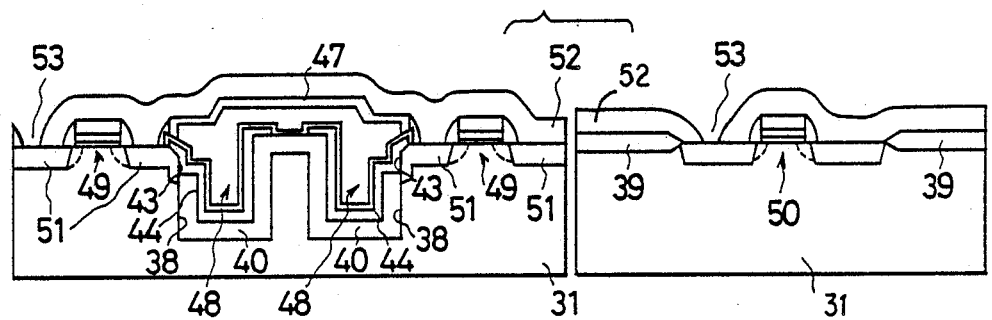
Figure 1J:
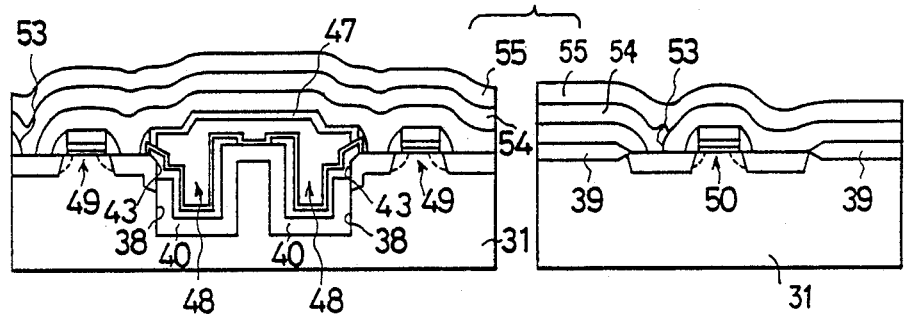

Subsequently, the capacitor dielectric layer 45 is removed except from the cell capacitor 48 and the laminated film 32 is also removed. A cell transfer transistor 49 and a peripheral transistor 50, both having an LDD structure, are formed using a conventional process, in a cell transfer transistor area of substrate 31 which has been exposed by removing the dielectric layer 45 and laminated film 32 (FIGS. 1H, I).

One of a plurality of source/drain diffusion layers 51 of cell transfer transistor 49 is then put into contact with the capacitor lower electrode 44, the diffusion layer extending over the exposed area near the edge of the trench 38 in the silicon substrate 31. This is done by expansion of the diffusion layer and, where conducting polysilicon is used for this electrode, by a diffusion region 60 of impurities from the polysilicon.

An insulating film 52 is &hen deposited over the whole surface of substrate 31 using the conventional process, contact holes 53 are opened is this insulating film, (FIG. 1I), the metallization 54 is formed, and a passivation film 55 is deposited on this (FIG. 1J) so as to give the final structure.

As has been described in this invention, a cell capacitor is formed in a trench in a semiconductor substrate. Due to the depth of the trench, it is possible to obtain a capacitor occupying only a relatively small surface area of the top of the substrate and having a relatively large capacitance, which is very useful for miniaturization and for high density applications. The inner wall of the trench is covered with a fairly thick oxide film and a capacitor comprising a lower electrode, dielectric layer and upper electrode is formed in the trench which is insulated from the substrate by the oxide film. As a result, the cell capacitor can be made extremely resistant to soft errors. Further, the thick oxide film is formed on the interior walls of the trench except on part of the trench inner wall, the contact between the lower electrode of the cell capacitor and the cell transfer transistor being made on the part of the inner wall which is so exposed. The surface area of the substrate required for contact can thus be made extremely small, which is very useful for miniaturization and for high density applications.

Further, it will also be evident from the above embodiment that the manufacturing process steps can be reduced if the oxide film 40 on the trench inner wall is formed at the same time as the isolation oxide film 39.

What is claimed is:

1. A process for manufacturing a semiconductor memory device, comprising the steps of:
    (a) providing a semiconductor substrate having a surface which includes a cell area for a plurality of memory cells, and a peripheral transistor area;
    (b) forming a trench in a surface of the semiconductor substrate in the cell area, the trench having an inner wall including a side wall and a bottom wall and an edge where the side wall meets the surface of the semiconductor substrate, the trench for each memory cell being isolated from the trenches for other memory cells;
    (c) partially oxidizing the surface of the semiconductor substrate to simultaneously form an inner wall oxide layer on the side wall and the bottom wall of the trench and an isolation oxide layer in the peripheral transistor area;
    (d) removing the inner wall oxide layer from the side wall in the vicinity of the edge of the trench to expose the substrate forming the edge of the trench;
    (e) forming a lower capacitor plate on the exposed substrate at the edge of the trench and on the inner wall oxide layer disposed on the side wall and the bottom wall of the trench, the part of the lower capacitor plate on the side wall and the part of the lower capacitor plate on the bottom wall being continuous with each other;
    (f) forming a dielectric layer on the surface of the lower capacitor plate;
    (g) forming an upper capacitor plate on the dielectric layer; and
    (h) forming a cell transfer transistor having a source region and a drain region in the cell area adjacent to the trench and a peripheral transistor in the peripheral transistor area, such that the cell transfer transistor is in electrical contact with the lower capacitor plate on the exposed portion.

2. A process according to claim 1, wherein in step (b), said trench is formed by reactive ion etching.

3. A process according to claim 1, wherein in step (b), said trench is formed to have a depth of about 1μm.

4. A process according to claim 1, wherein in step (e), said lower capacitor is formed as a polysilicon layer.

5. A process according to claim 1, wherein in step (f), said dielectric layer is formed such that it comprises an SiN layer and an SiO$_2$ layer.

6. A process according to claim 1, wherein in step (g), said upper capacitor plate is formed as a polysilicon layer.

7. A process according to claim 1, wherein in step (c), the inner wall oxide layer and said isolation oxide layer are formed by thermal oxidation using a laminated film as a mask.

8. A process according to claim 7, wherein in step (c), said laminated film is formed such that it comprises an SiN layer and an SiO$_2$ layer.

* * * * *